(12) United States Patent
Chern et al.

(10) Patent No.: US 7,974,136 B2
(45) Date of Patent: Jul. 5, 2011

(54) METHOD FOR ERASING A FLASH MEMORY CELL OR AN ARRAY OF SUCH CELLS HAVING IMPROVED ERASE COUPLING RATIO

(75) Inventors: Geeng-Chuan Michael Chern, Cupertino, CA (US); Ben Sheen, Milpitas, CA (US); Jonathan Pabustan, San Lorenzo, CA (US); Der-Tsyr Fan, Taiwan (TW); Yaw Wen Hu, Cupertino, CA (US); Prateep Tuntasood, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 41 days.

(21) Appl. No.: 12/645,337

(22) Filed: Dec. 22, 2009

(65) Prior Publication Data

US 2010/0157687 A1    Jun. 24, 2010

Related U.S. Application Data

(62) Division of application No. 12/027,654, filed on Feb. 7, 2008, now Pat. No. 7,668,013.

(51) Int. Cl.
*G11C 16/04* (2006.01)
(52) U.S. Cl. ......... 365/185.29; 365/185.17; 365/185.18; 365/185.19; 365/185.22
(58) Field of Classification Search ............ 365/185.17, 365/185.18, 185.19, 185.22, 185.29
See application file for complete search history.

(56) References Cited

U.S. PATENT DOCUMENTS

| | | | |
|---|---|---|---|
| 5,455,792 A * | 10/1995 | Yi | 365/185.15 |
| 2005/0207199 A1 * | 9/2005 | Chen et al. | 365/51 |
| 2005/0207225 A1 * | 9/2005 | Chen et al. | 365/185.17 |

* cited by examiner

*Primary Examiner* — Hoai V Ho
(74) *Attorney, Agent, or Firm* — DLA Piper LLP (US)

(57) ABSTRACT

A flash memory cell is of the type having a substrate of a first conductivity type having a first region of a second conductivity type at a first end, and a second region of the second conductivity type at a second end, spaced apart from the first end, with a channel region between the first end and the second end. The flash memory cell has a plurality of stacked pairs of floating gates and control gates with the floating gates positioned over portions of the channel region and are insulated therefrom, and each control gate over a floating gate and insulated therefrom. The flash memory cell further has a plurality of erase gates over the channel region which are insulated therefrom, with an erase gate between each pair of stacked pair of floating gate and control gate. In a method of erasing the flash memory cell, a pulse of a first positive voltage is applied to alternating erase gates ("first alternating gates"). In addition, a ground voltage is applied to erase gates other than the first alternating gates ("second alternating gates"). In a second method to erase the flash memory cell, a pulse of a first positive voltage is applied to the first alternating gates and a negative voltage is applied to the second alternating gates and to all control gates.

8 Claims, 7 Drawing Sheets

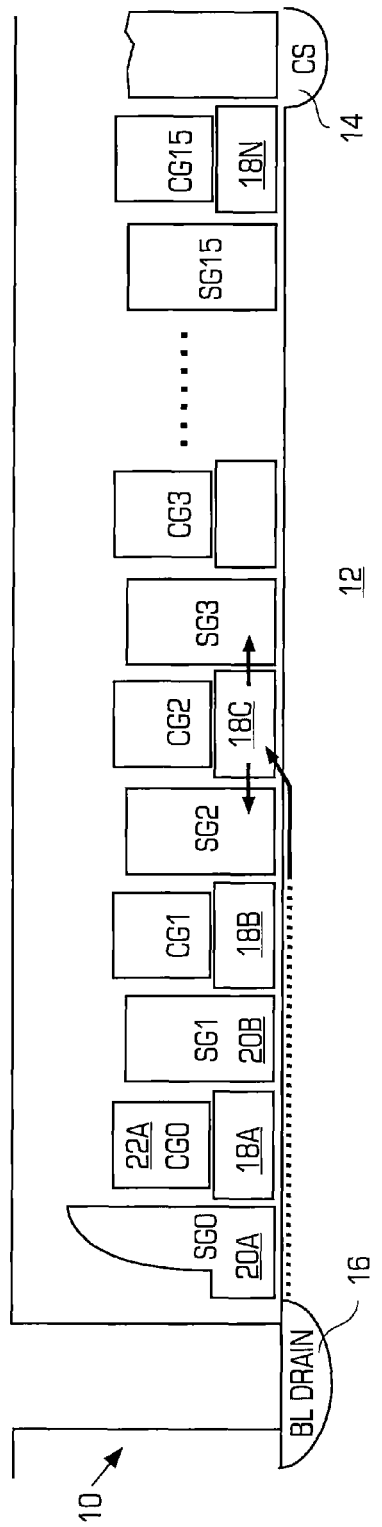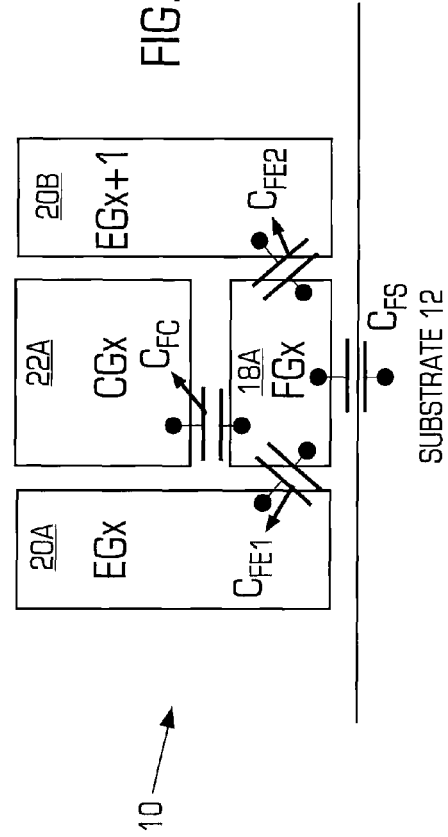
FIG. 1 - PRIOR ART
FIG. 2 ured to form the substrate and its channel region are well known in the art and will not be described further. Instead, the memory cell is operated in the normal mode of the prior art, i.e., to erase the memory cell, a positive voltage is applied to all the erase gates in the block. In the description that follows, it will be understood that the prior art is maintained.

METHOD FOR ERASING A FLASH MEMORY CELL OR AN ARRAY OF SUCH CELLS HAVING IMPROVED ERASE COUPLING RATIO

CROSS REFERENCE TO RELATED APPLICATIONS

This application is a divisional of U.S. application Ser. No. 12/027,654, filed Feb. 7, 2008, now as U.S. Pat. No. 7,668,013, the entire contents of which is incorporated herein by reference.

The present invention relates to a method for erasing a flash memory cell, such as a NAND cell or a NOR cell or an array thereof having improved erase coupling ratio.

TECHNICAL FIELD

Background of the Invention

A non-volatile memory cell or an array of such cells is well known in the art. Typically, non-volatile memory cells are grouped in a sector and/or a block and all the cells within a sector or a block are erased simultaneously.

One particular type of non-volatile memory is a NAND cell array, wherein each sector or block in the array comprises many strings of stacked pairs of floating gates and control gates on top thereof. Between each pair of stacked pairs is an erase gate. See U.S. Pat. Nos. 6,885,586 and 6,992,929, whose disclosures are incorporated herein by reference in their entirety. See also "Split-Gate NAND Flash memory At 120 nm Technology Node Featuring Fast programming and Erase" by C. Y. Shu et al, 2004 symposium on VLSI Technology Digest of Technical papers, p. 78-79, which is also referenced in FIGS. 1(a) and 1(b) of U.S. Pat. No. 7,247,907; both of there references are also incorporated herein by reference in their entirety.

Another type of non-volatile memory is a NOR cell array, wherein each sector or block in the array comprises many strings of memory cell pairs. Referring to FIG. 3a there is shown a cross-sectional view of a unit of NOR cells of the prior art. FIG. 3b is a schematic representation of the cell shown in FIG. 3a. Each pair of memory cells comprises of two stacks of floating gates (see FG0 and FG1 in FIG. 3a) and control gates on top (see CG0 and CG1) an erase gate in between (see EG1), and two other erase gate, which also serve as select gates, or word lines during read operation (see WL0 (aka EG0) and WL1 (EG2)), on two other sides of the two stacks of floating gates and control gates on top. There is also a bit line contact between each two pairs of the 2-cell pairs.

In this type of memory cell, however, during erase operation, all of the erase gates in a cell or in an erase block are electrically connected together and the same erase voltage is applied to all of the erase gates in the erase block.

It is also well known in the prior that erase efficiency is proportional to the erase coupling ratio. As the erase coupling ratio is reduced, erase efficiency is increased.

Thus, it is one of object of the present invention to increase the erase efficiency by decreasing the erase coupling ratio.

Another object of the present invention is to improve the write-erase endurance performance. This type of memory cell is usually erased by tunneling electrons through a layer of inter-poly dielectric from a floating gate to an erase gate. During tunneling, a small portion of electrons are usually trapped in the inter-poly dielectric layer and, thus, increases the potential barrier to retard electron tunneling. When the trapped electrons accumulate to build up a high enough potential barrier after a certain write-erase cycles, erase can not be performed with the same applied erase voltage, which causes the memory cell to fail operation. The present invention allows the memory cell to switch to the other group of erased gate and/or increase the erase voltage for erase operation when the erase operation by the first group of erase gates fails, and the memory cell can continue functioning until more trapped electrons are built up.

SUMMARY OF THE INVENTION

Accordingly, in one method of the present invention, a flash memory cell is of the type having a substrate of a first conductivity type. The flash memory cell has a plurality of stacked pairs of floating gates and control gates with the floating gates positioned over portions of the substrate and are insulated therefrom, and each control gate over a floating gate and insulated therefrom. The flash memory cell further has a plurality of erase gates over the substrate which are insulated therefrom, with an erase gate between each pair of stacked pair of floating gate and control gate. In one method of the present invention, the method comprises applying a pulse of a first positive voltage to alternating erase gates ("first alternating gates"). In addition, a ground voltage is applied to erase gates other than the first alternating gates ("second alternating gates").

In another method of the present invention, involving a flash memory cell having the same structural elements, the method comprises applying a pulse of a first positive voltage to the first alternating gates and applying a negative voltage to second alternating gates and to all control gates.

BRIEF DESCRIPTION OF THE DRAWINGS

FIG. 1 is a cross-sectional view of a NAND memory cell of the prior art.

FIG. 2 is a. cross sectional view of a portion of the memory cell shown in FIG. 1.

FIG. 3b is a schematic representation of the NOR memory cell of FIG. 3a.

DETAILED DESCRIPTION OF THE INVENTION

Figure 3A:
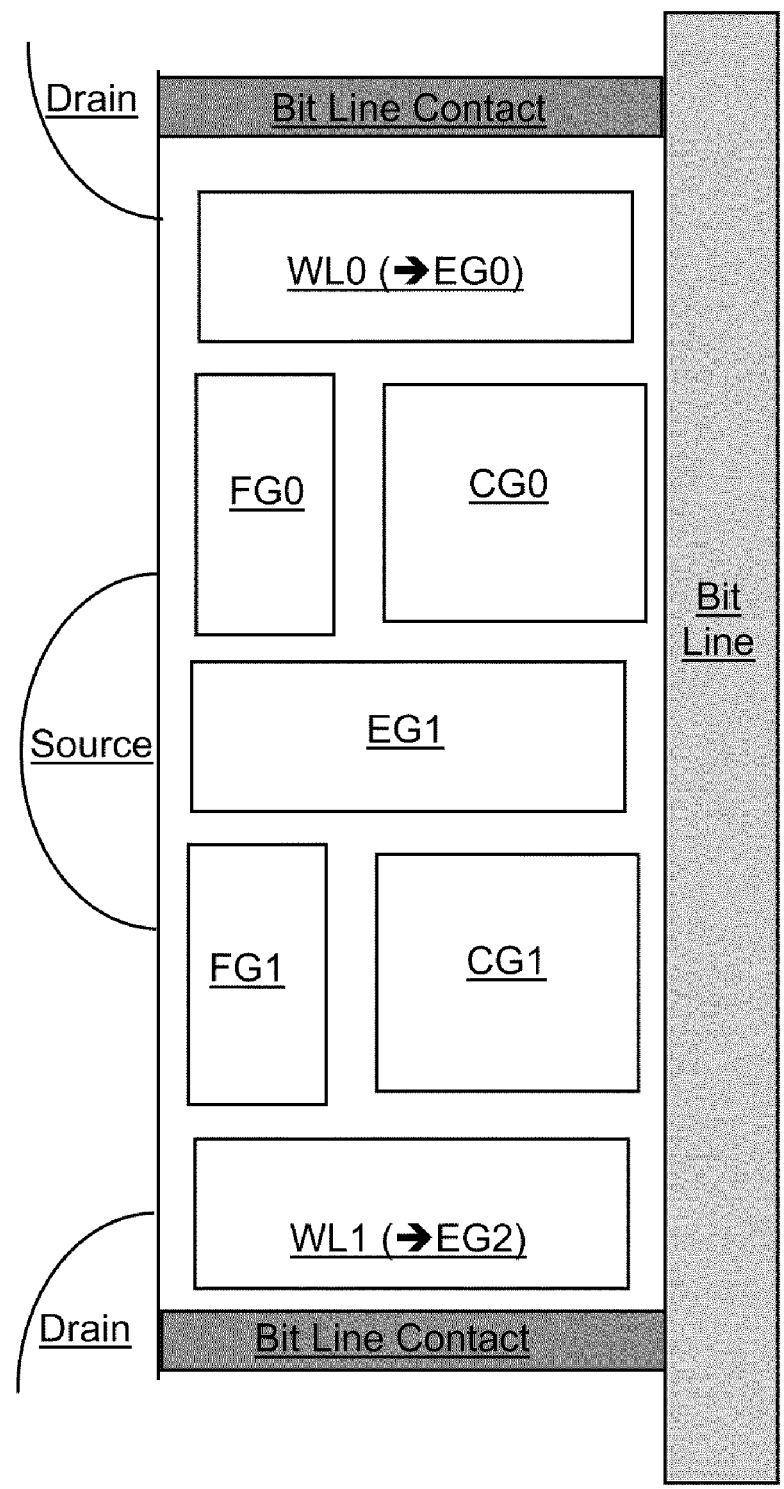
FIG. 3a is a cross-sectional view of a NOR memory cell of the prior art.

Referring to FIG. 1, there is shown a cross sectional view of a memory cell 10 of the prior art as shown in FIG. 1(a) of U.S. Pat. No. 7,247,907 and as disclose in "Split-Gate NAND Flash memory At 120 nm Technology Node Featuring Fast programming and Erase" by C. Y. Shu et al, 2004 symposium on VLSI Technology Digest of Technical papers, p. 78-79.

The NAND flash memory structure 10 is formed on a semiconductor substrate 12 of a first conductivity type. The NAND flash memory structure 10 has a first region 14 of a second conductivity type and a second region 16 of the second conductivity type in the substrate 12. The first region 14 and the second region 16 are spaced apart from one another to define a continuous channel region between the first region 14 and the second region 16. A plurality of floating gates (18A .

. . 18N) are spaced apart from one another with each floating gate 18 positioned over a separate portion of the channel region and separated and insulated therefrom. The structure 10 also has a plurality of control gates 22 with each control gate 22 associated with a floating gate 18 and forming a stacked gate configuration with the associated floating gate 18. Finally, the structure 10 has an erase gate 20 associated with each floating gate 18. The erase gate 20 is positioned over another portion of the channel region, and is immediately adjacent to the associated floating gate 18 and is insulated therefrom. An erase gate 20 is on each side of a floating gate 18 and its associated control gate 22.

The erase method of the present invention can be used with the memory cell structure 10. In addition, the erase method of the present invention can be used with the structure shown in FIGS. 4H, 6 or 8E of U.S. Pat. No. 6,992,929 or FIGS. 2, 4H, 6, 9, 11J, of U.S. Pat. No. 6,885,586. The difference between the memory structures shown in U.S. Pat. Nos. 6,992,929 and 6,885,586 and the structure 10 is that a region of the second conductivity type is in the substrate underneath the erase gate. Further, the erase gate may be in a trench.

However, the commonality of all the memory cell structures shown in FIG. 1 hereof, and U.S. Pat. No. 6,992,929 and U.S. Pat. No. 6,885,586 is that during the erase operation, all of the erase gates are connected to the same erase voltage. A portion of the structure shown in FIG. 1 hereof is shown in FIG. 2. In the prior art, during the erase operation, the method of erasing comprises connecting the erase gates 20a and 20b (as well as others in the same block—not shown) to the same voltage.

Figure 4:
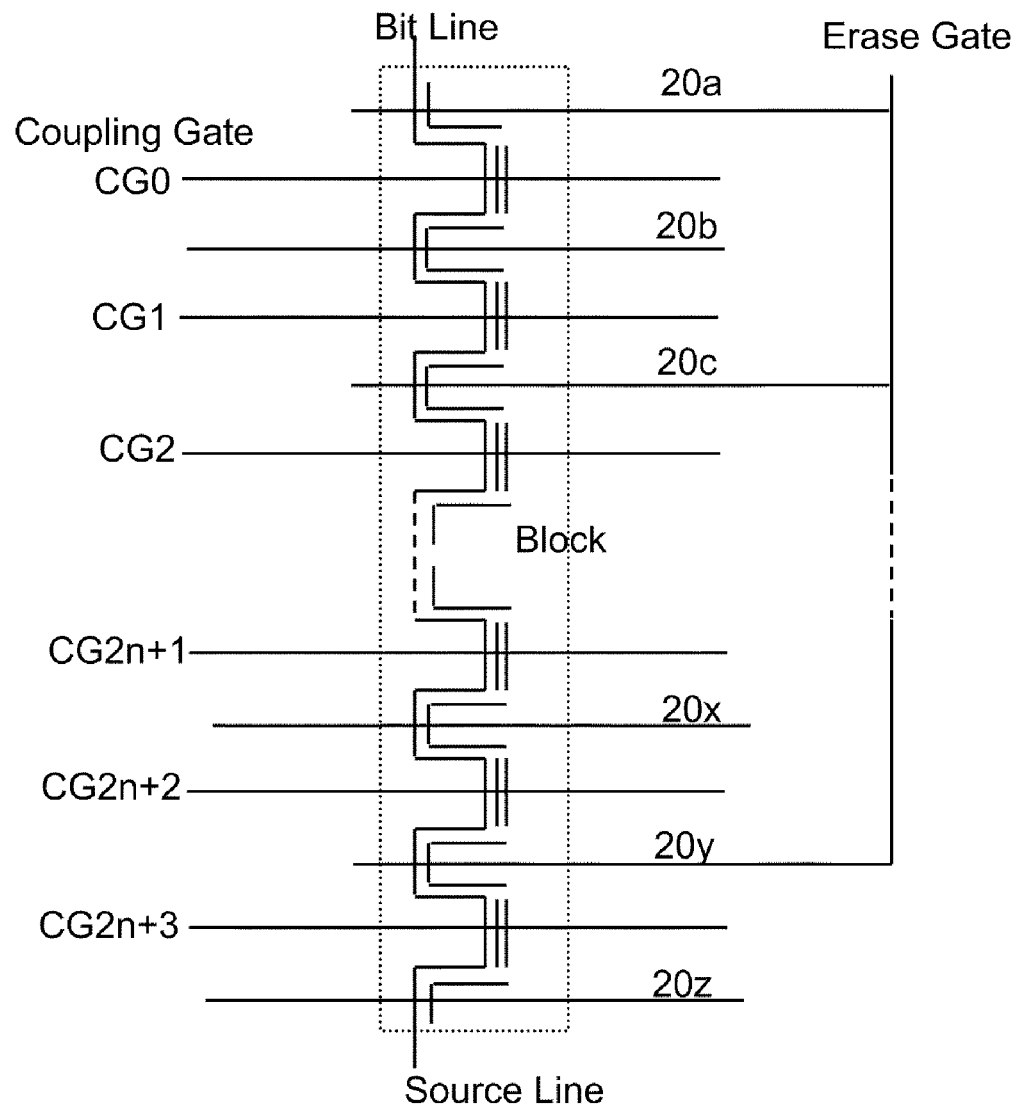
FIG. 4 is a circuit diagram of one embodiment of the method of the present invention with a NAND memory cell.

However, in the method of the present invention, a number of erase methods are disclosed. In the first method, all the even (or odd) erase gates are connected together. Thus, alternating erase gates, such as erase gates 20a, 20c, 20e etc. are electrically connected together. This is schematically shown in FIG. 4. In the erase operation all the electrically connected gates are supplied with an erase voltage such as +10-15 volts. All the other alternating erase gates, such as erase gates 20b, 20d, 20f etc. are all supplied with ground voltage or a negative voltage of –0--10 volts. In addition, the control gates 22 associated with all the floating gates 18 are also all connected together to a ground voltage or a negative voltage of –0--10 volts. The action of this erase method on the floating gate 18a, shown in FIG. 2 is as follows. The erase gate 20a to one side of the floating gate 18a is supplied with an erase voltage of +10-15 volts. The erase gate 20b, immediately adjacent to another side of floating gate 18b is connected to ground or a negative voltage of –0--10 volts. The control gate 22a is also connected to ground or a negative voltage of –0--10 volts. Finally, the substrate 12 is also connected to ground. In the erase operation, the erase coupling ratio between the floating gate 18a and erase gate 20a is $$CR_{FE1} = C_{FE1}/(C_{FE1} + C_{FC} + C_{FE2} + C_{FS})$$

While the erase gates 20a and 20b are connected together for erase as in the prior arts, the erase coupling ratio becomes $$CR_{FE1\text{-}FE2} = (C_{FE1} + C_{FE2})/(C_{FE1} + C_{FC} + C_{FE2} + C_{FS})$$

Clearly, the erase coupling ratio is reduced compared to that of the prior art, thereby increasing the erase efficiency.

The erase operation can also be performed with verify. In this case, the positive erase voltages, such as +10-15 volts may be applied to the alternating erase gates, such as erase gates 20a, 20c, 20e etc., and the other erase gates and all control gates are connected to voltages similar to those in the previous erase scheme without verify, in a single pulse, after which an erase verify operation (a read operation) is performed to determine if all the floating gates 18(a-z) have been erased. In the event the erase verify operation shows that the memory cell 10 is erased, then the erase operation is terminated. In the event not all of the floating gates (a-z) of the memory cell 10 is erased, then the erase operation may continue. This may be by continuing to apply additional pulses of +10-15 volts, or by applying pulses of positive voltages greater than the +10-15 volts.

Figure 5:
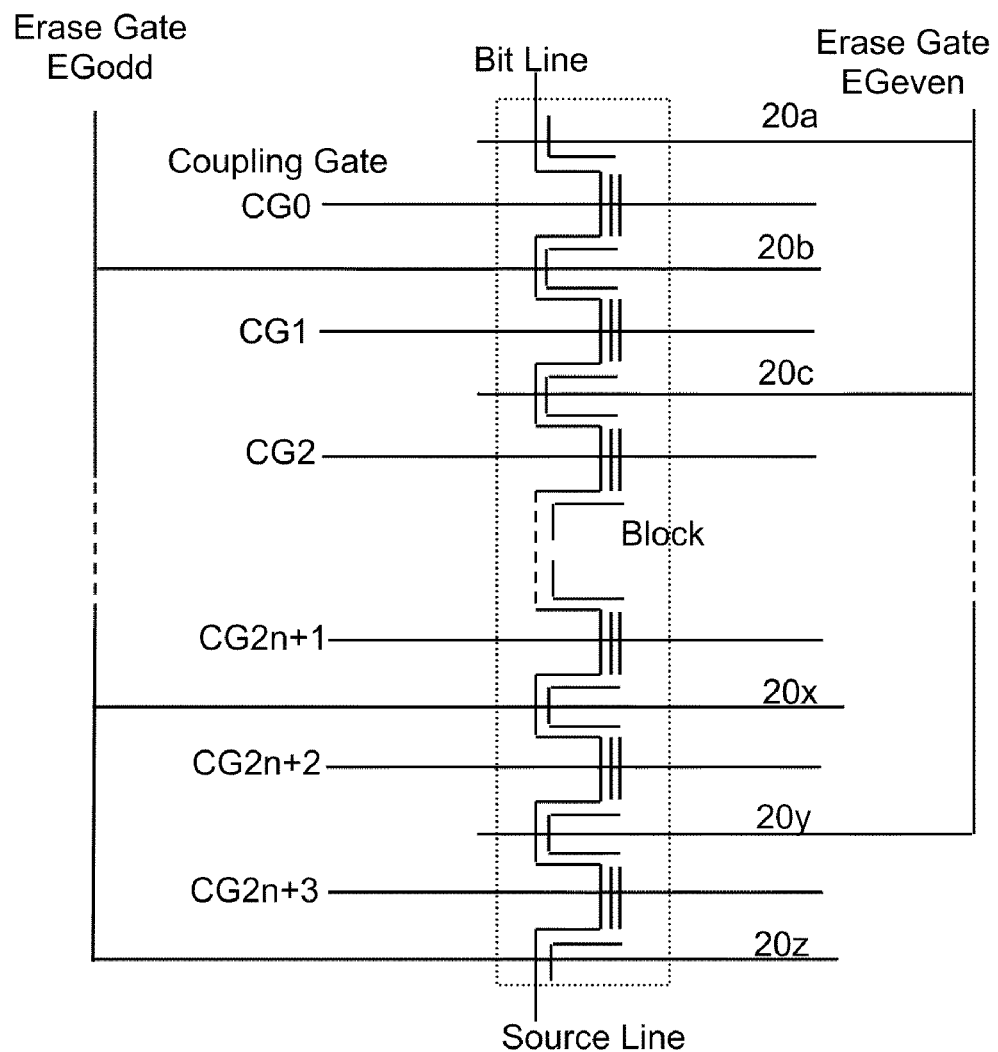
FIG. 5 is a circuit diagram of another embodiment of the method of the present invention with a NAND memory cell.

In a second method of the present invention, all the even erase gates, such as erase gates 20a, 20c, 20e etc., are connected together. Thus, a first alternating erase gates are electrically connected together. Then the odd erase gates, such as erase gates 20b, 20d, 20f etc. are also connected together. Thus, a second alternating erase gates are all connected together. This is schematically shown in FIG. 5. In the erase operation all the first alternating erase gates are supplied with an erase voltage such as +10-15 volts. All the second alternating erase gates, such as erase gates 20b, 20d, 20f etc. are all supplied with ground voltage. In addition, the control gates 22 associated with all the floating gates 18 are also all connected together to a ground voltage. This is called erasing the first alternating erase gates. Alternatively, a voltage lower than the +10-15 volts, such as +5-10 volts is applied to the first alternating erase gates, and a negative voltage, such as –10--5 volts is applied to the second alternating erase gates. All control gates 22 can be connected to a ground or negative voltage.

There are several variations in the second method of the present invention. In the first variation of the second method of the present invention, a voltage pulse is applied to the first alternating erase gates for the first erase operation, while keeping the second alternating erase gates and all control gates connected to ground or a negative voltage as described above. When the second erase command is issued to the memory chip, a voltage pulse is applied to the second alternating erase gates, and the first alternating erase gates and all control gates are connected to ground or a negative voltage. For the 3rd, 5th, 7th, etc. erase operation, the erase scheme is the same as that for the 1st one. The erase scheme for the 4th, 6th, 8th, etc. erase operation is the same as that for the 2nd one. This way, the probability of electron trapping in the inter-poly dielectric layer is reduced, and more trap-up is allowed since there are inter-poly dielectric layers at two different locations for trap-up, thus improving the write-erase endurance.

In a second variation of the method of the present invention, a voltage pulse is applied to erase the first alternating erase gates, and the second alternating erase gates and all control gates are connected to ground or a negative voltage. Then an erase verify operation is performed. If the erase verify operation passes, then the erase operation terminates. Otherwise, the method continues by applying a voltage pulse to erase the second alternating erase gates, and keeping the first alternating erase gates and all control gates connected to ground or a negative voltage. This is followed by another erase verify operation. This sequence of erasing through either the first (or second) alternating erase gates followed by an erase verify operation, followed by erasing through the second (or first) alternating erase gates, followed by an erase verify operation continues until a pre-set number of erase operations is reached.

In a third variation of the second method of the present invention, the write-erase endurance can be further improved. If the erase verify operation still fails when the pre-set number of erase operations is reached in the second variation of the second method of the present invention, the erase voltages can be increased, and the same sequence as in the second variation of the second method of the present invention can repeated. The erase voltages can be increased and the same sequence can be repeated again and again in the third variation until maximum pre-set voltages are reached.

Figure 3B:
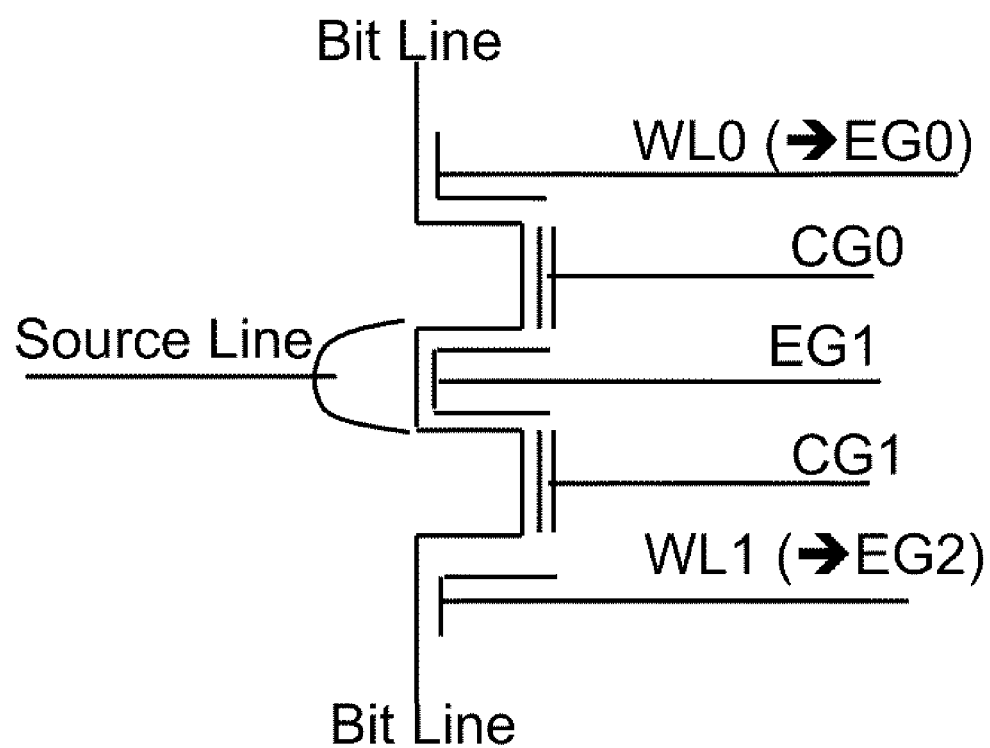
Figure 6:
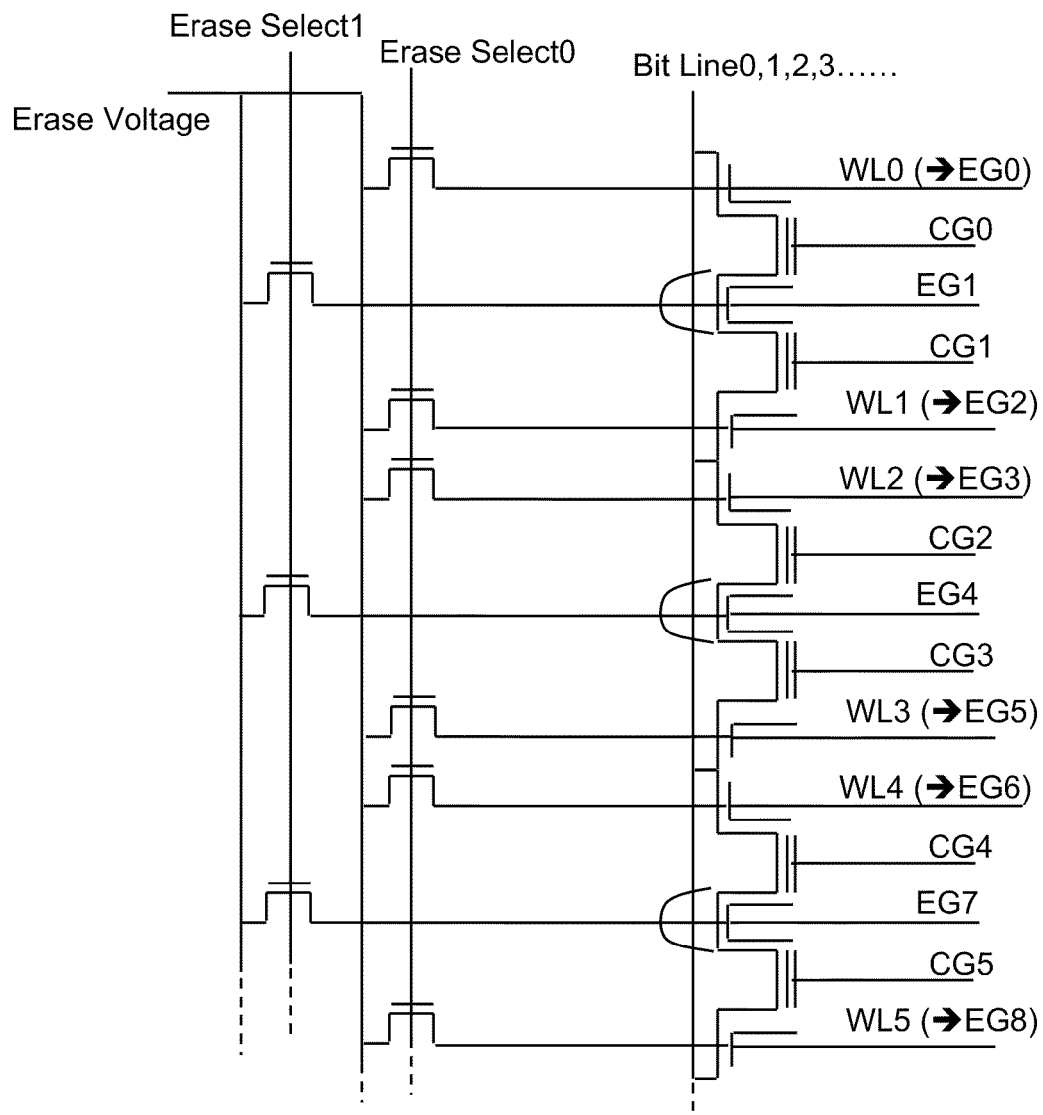
FIG. 6 is a circuit diagram of one embodiment of the method of the present invention with a NOR memory cell.

As previously discussed, the method of the present invention may also be used with the NOR type of non-volatile memory cell shown in FIG. 3a and which is schematically shown in FIG. 3b. Similar to the erase method for the NAND array shown in FIG. 1, there are a number of different methods of the present invention for the erase of NOR cells of the type shown in FIG. 3a. In the first method, a string of NOR cells, is shown in FIG. 6. Each paired cells has erase gates EG0, EG1, and EG2. A companion paired NOR cell has erase gates EG3, EG4 and EG5. Finally, a third adjacent paired NOR cell has erase gates EG6, EG7 and EG8. In a first method of the present invention, the first erase gates EG0, EG2, EG3, EG5, EG6 and EG8 are all electrically connected together during the erase operation. These are the word lines structures. Although the erase gates EG2 and EG3 and the erase gates EG5 and EG6 are adjacent to one another, for the purpose of being the first erase gates, the erase gates EG2 and EG3 may be considered one unit, and thus they are alternating to the erase gate EG0. Similarly, the erase gates EF5 and EG6 may be considered one unit and are thus alternating to the erase gate unit EG2 and EG3. The second erase gates: EG1, EG4 and EG7 are electrically connected together during the erase operation. These are the erase gates "above" the source line. Thus, in the first method, the first alternating erase gates are connected to an erase voltage, such as +10-15 volts, while the second alternating gates are all connected to ground. The control gates associated with all the floating gates, such as CG0, CG1, CG2, CG3, CG4 and CG5 are also connected to ground. Alternatively, a voltage lower than +10-15 volts, such as +5-10 volts are applied to the first alternating erase gates, and a negative voltage such as −10 to −5 volts is applied to the second alternating erase gates. All of the control gates can be connected to ground or to a negative voltage. Similar to the three variations described above for the erase of NAND array, the same variations can also be used for the erase method for the NOR cell shown in FIG. 3a.

Figure 7:
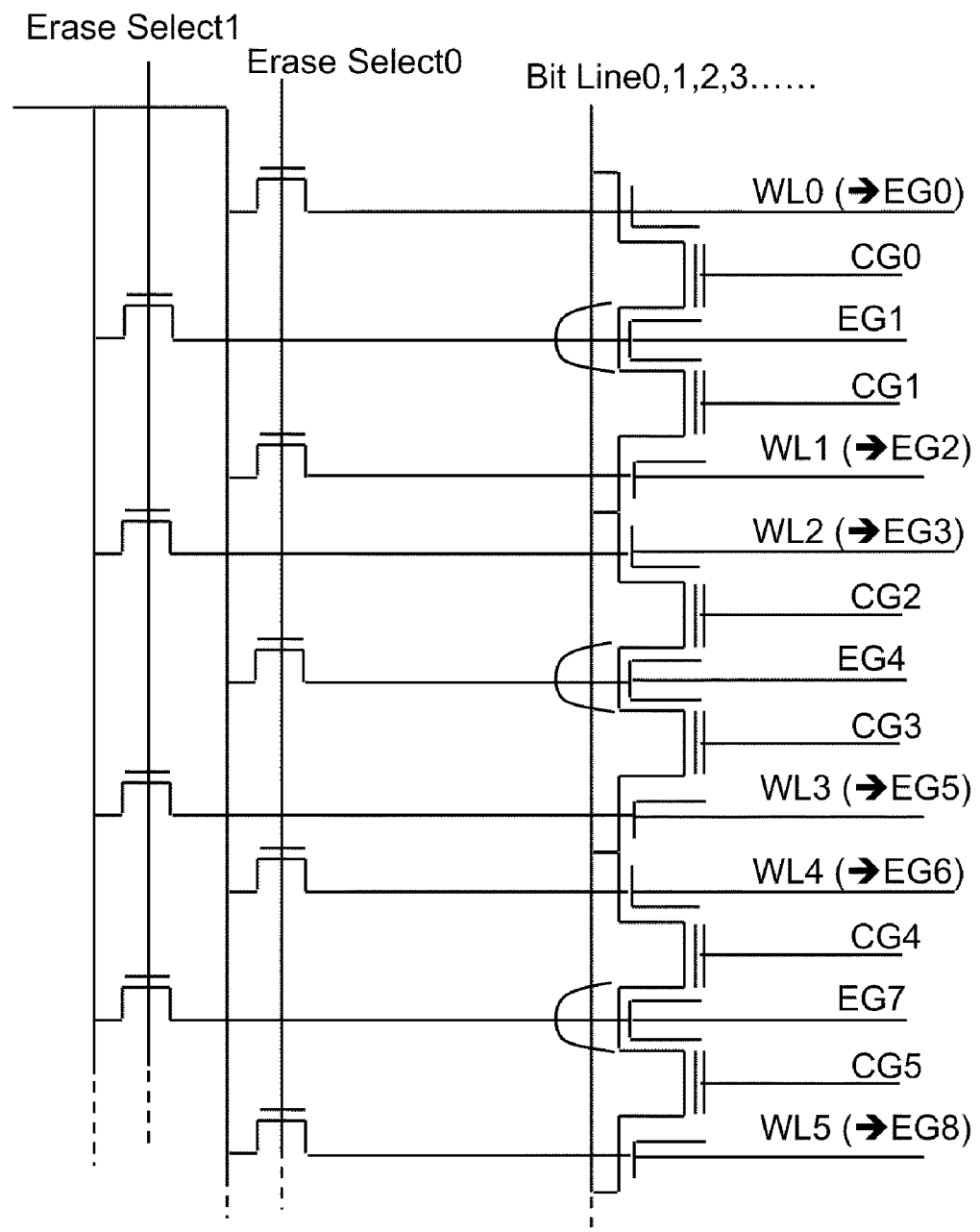
FIG. 7 is a circuit diagram of another embodiment of the method of the present invention with a NOR memory cell.

In another variation of the method of erasing for a NOR array, FIG. 7 shows the circuit connection for the various erase gates in this method. In this method, the first alternating erase gates are: EG0, EG2, EG4, EG6 and EG8, while the second alternating gates are: EG1, EG3, EG5, and EG7. Similar to the method described for the erase operation for the array shown in FIG. 6, the first alternating erase gates are supplied with an erase voltage while the second alternating erase gates are applied with ground voltage. The voltage may be lowered to the first alternating erase gates with a negative voltage applied to the second alternating erase gates. Again, a number of variations of this method, consistent with the description for the erasure of NAND arrays, are also possible.

As can be seen from the foregoing, with the methods of the present invention, the overall erase coupling ratio is reduced, thereby increasing the erase efficiency. The write-erase endurance is also improved.

What is claimed is:

1. In a flash memory cell of the type having a substrate of a first conductivity type, a plurality of stacked pairs of floating gates and control gates with the floating gate positioned over a portion of the substrate and insulated therefrom, and the control gate over the floating gate and insulated therefrom; a plurality of erase gates over the substrate and insulated therefrom, with an erase gate between each pair of stacked pair of floating gate and control gate, wherein a method of erasing the flash memory cell comprising:

applying a pulse of a first positive voltage to alternating erase gates ("first alternating gates"); and applying a negative voltage to erase gates other than the first alternating gates ("second alternating gates").

2. The method of claim 1 further comprising:
applying the negative voltage to the control gates.

3. The method of claim 1 further comprising:
applying a pulse of the first positive voltage for a preset number of times before performing an erase verify operation.

4. The method of claim 1 further comprising:
applying the negative voltage to the first alternating gates;
applying a pulse of the first positive voltage to the second alternating gates.

5. The method of claim 2 further comprising:
performing an erase verify operation;
terminating the erase method in the event the erase verify operation shows the memory cells is erased;
continuing the erase operation in the event the memory cell is not completely erased, by applying a pulse of a second positive voltage to the first alternating gates.

6. The method of claim 5 wherein the second positive voltage is greater than the first positive voltage.

7. The method of claim 1 wherein said memory cell is of NAND type.

8. The method claim 1 wherein said memory cell is of NOR type.

* * * * *